(12) United States Patent  (10) Patent No.: US 6,558,109 B2
Gibbel  (45) Date of Patent: May 6, 2003

(54) METHOD AND APPARATUS FOR SEPARATING WAFERS

(75) Inventor: David S. Gibbel, Falls City, OR (US)

(73) Assignee: Automation Technology, Inc., Salem, OR (US)

( * ) Notice: Subject to any disclaimer, the term of this patent is extended or adjusted under 35 U.S.C. 154(b) by 0 days.

(21) Appl. No.: 09/865,738

(22) Filed: May 24, 2001

(65) Prior Publication Data

US 2001/0046435 A1 Nov. 29, 2001

Related U.S. Application Data

(60) Provisional application No. 60/207,697, filed on May 26, 2000.

(51) Int. Cl.[7] .............................................. B65G 59/04
(52) U.S. Cl. ................. 414/795.5; 414/797; 414/796.9; 414/797.1; 414/801; 294/64.3
(58) Field of Search .............................. 414/797, 797.5, 414/941, 796.5, 737, 752.1, 795.5, 796.9, 797.1; 294/64.1, 64.3, 907; 901/40

(56) References Cited

U.S. PATENT DOCUMENTS

| | | | |
|---|---|---|---|
| 5,213,451 A | 5/1993 | Frank et al. | |
| 5,722,811 A | * 3/1998 | Schum et al. | 271/97 |
| 5,863,375 A | 1/1999 | Cha et al. | |
| 5,984,622 A | * 11/1999 | Schum et al. | 271/97 |
| 6,074,163 A | * 6/2000 | Yamazaki et al. | 271/97 |
| 6,318,777 B1 | * 11/2001 | Tanaka et al. | 294/64.1 |

* cited by examiner

*Primary Examiner*—Eileen D. Lillis
*Assistant Examiner*—Michael J. Kwon
(74) *Attorney, Agent, or Firm*—Klarquist Sparkman, LLP

(57) ABSTRACT

Wafers are separated individually from a stack by directing multiple jets of fluid between an outermost wafer in the stack and an adjacent wafer. The jets have sufficient pressure and are sufficiently spaced apart around the wafer stack to cause the outermost wafer to separate longitudinally from the adjacent wafer without lateral movement there between. In the illustrated embodiment, a chuck is attached to a planar surface of the outermost wafer. The attached wafer and wafer stack, once separated by the jet of fluid, are moved relatively apart, such as by movement of the chuck. The wafers in the stack are thereby separated without contact between a wafer edge and a solid object (such as a container wall or hand), minimizing the risk of wafer breakage.

20 Claims, 4 Drawing Sheets

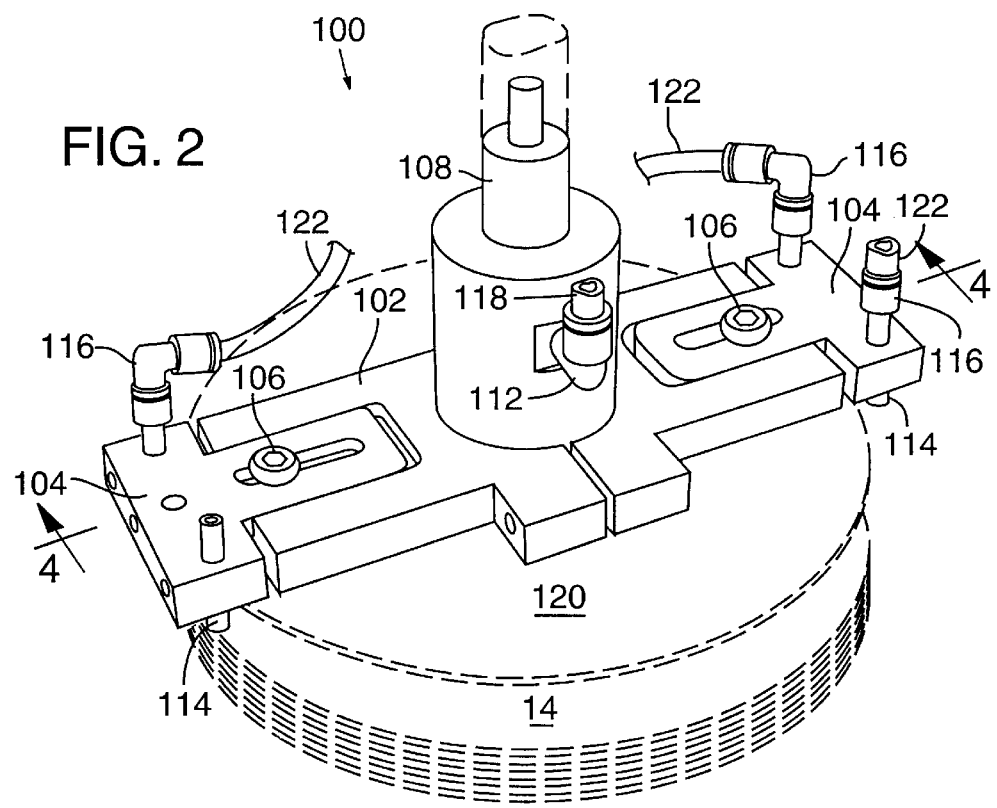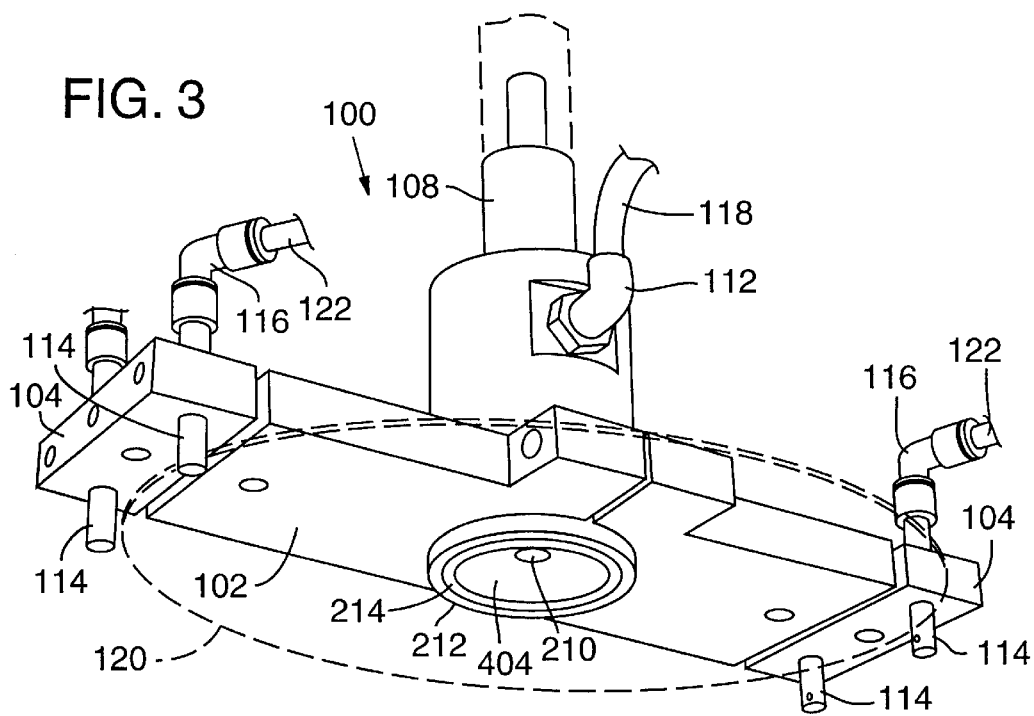

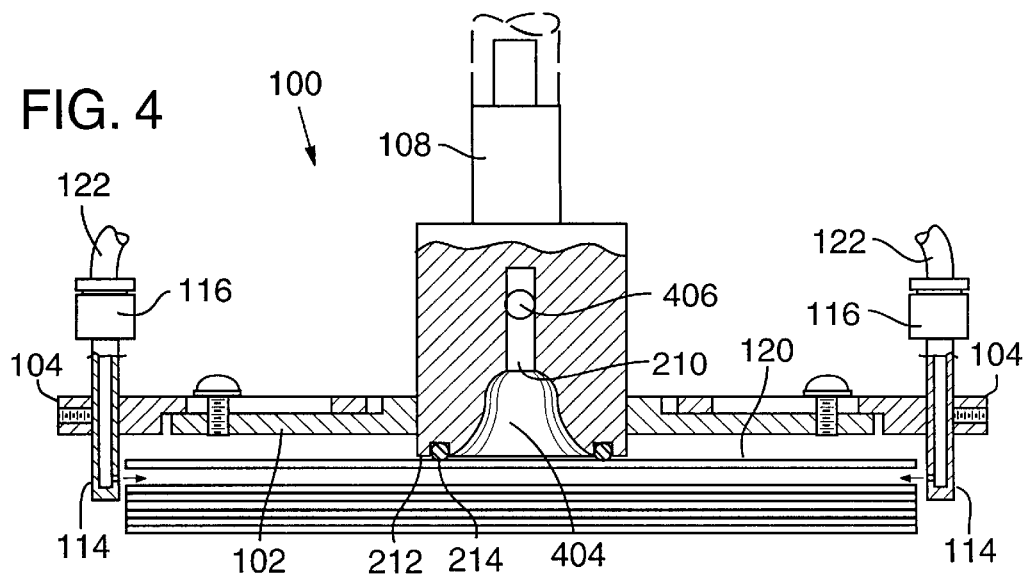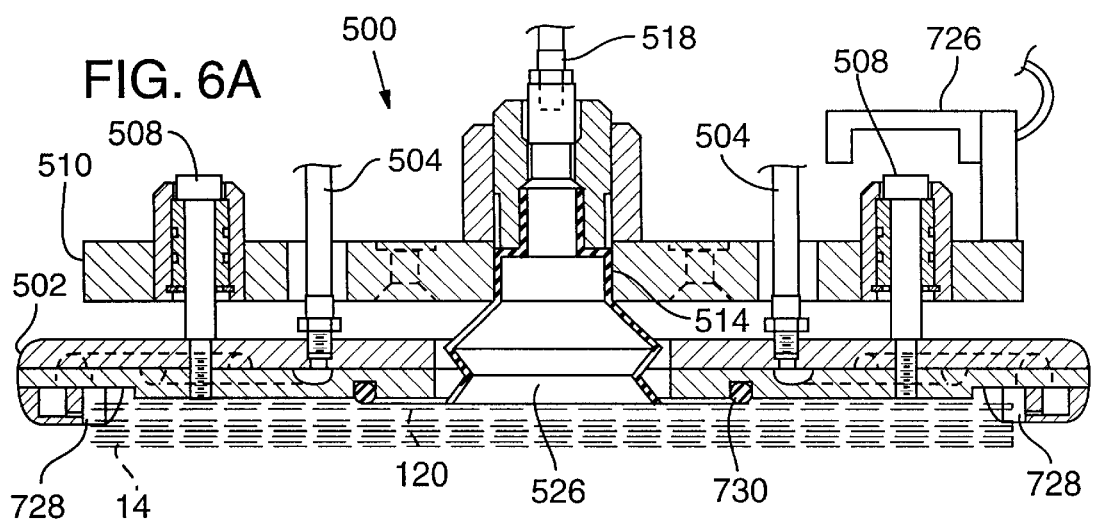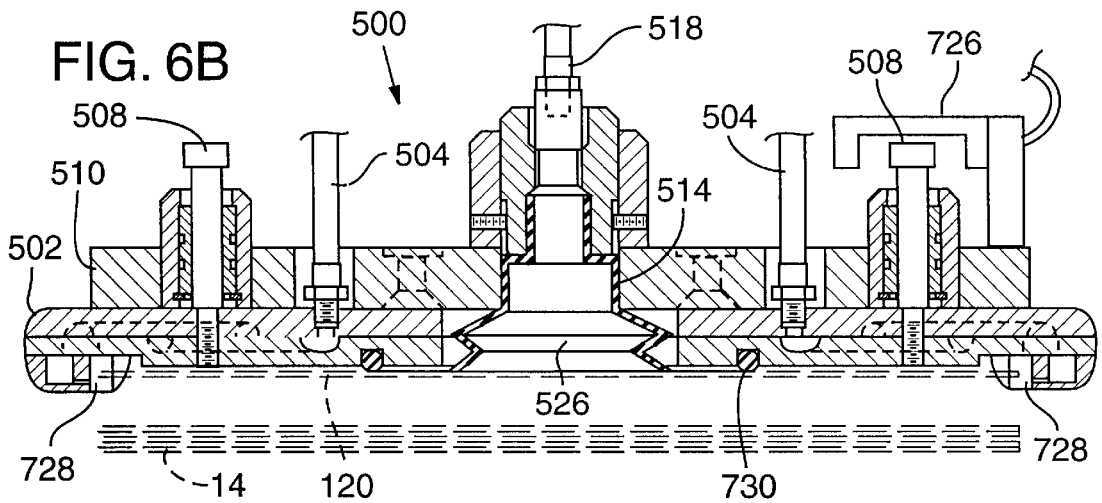

METHOD AND APPARATUS FOR SEPARATING WAFERS

This patent claims the benefit of the earlier filing date of U.S. Provisional Application No. 60/207,697, filed on May 26, 2000. The entire disclosure U.S. Provisional Application No. 60/207,697 is considered to be part of the disclosure of this patent and is incorporated herein by reference.

TECHNICAL FIELD

This invention relates generally to separating wafers (or similar structures) from a stack of wafers. More particularly, this invention relates to separating wafers without damaging contact with their edges, thereby eliminating breakage otherwise caused by such contact.

BACKGROUND

The manufacture of semiconductor parts, or "chips," typically begins with the processing of wafers made from silicon, gallium arsenide, or other semiconductor compounds. Initially, a crystalline (or polycrystalline) boole is sawn simultaneously into several hundred thin wafers using means such as a wire frame saw. The wafers are typically quite thin, of the order of 200 microns thick, and are most often of circular cross-section. This sawing produces a stack of wafers contaminated with sawdust and sawing fluid. The wafers must then be removed from the stack, cleaned, and placed into a product carrier such as a cassette or tray before further processing.

Removing the wafers from the stack is typically done manually because the wafer material is brittle. Rough handling can easily result in breakage, or chipping of the edges, which would render the wafer useless for further manufacture. To prevent such damage, vacuum "wands" are commonly employed as a means for manually lifting individual wafers from the stack. A wand typically consists of a stem with an internal channel for vacuum, a broad tip, and a vacuum actuator switch for connecting the stem to a vacuum source. An operator picks up a wafer by placing the broad tip of the wand in the center of the planar surface of the wafer, thereby allowing the vacuum to cause the wafer to adhere to the wand. The operator can then transport the wafer from one location to another, and can then release the wafer by shutting off the vacuum to the wand.

Although adequate, manually separating wafers has a number of drawbacks. The wafers in a stack have a tendency to stick to one another, primarily due to surface tension effects. A wand alone cannot overcome these effects, requiring the operator to slide the wafers apart by pushing against their edges. This handling can damage the wafers. Furthermore, the labor required is a significant processing cost and takes considerable time.

Attempts to automate the separating process have been tried but not widely adopted. U.S. Pat. No. 5,213,451 to Frank et al. describes the use of a dam and jets of fluid, such as water or oil, to separate wafers in a stack. The jets push the outermost wafer up and over the dam while the wafers beneath are restrained in the stack by the dam. A feed unit gradually lifts the wafer stack, causing each wafer to eventually be pushed over the dam by the fluid jets. While this method is faster than manually separating the wafers, it still exposes them to potential damage. The fluid jets cause the outermost wafer to slide against the adjacent wafer and drive the thin edges of the other wafers against the dam, either action of which can cause wafer breakage.

An objective of the invention, therefore, is to separate the wafers in a stack without causing sliding contact between the wafers. Another objective is to separate the wafers without striking the wafer edges with a force sufficient to damage them.

SUMMARY

In accordance with the invention, a novel method for individually separating wafers from a stack of wafers is disclosed. Briefly, the method comprises directing multiple jets of fluid between an outermost wafer in the stack and an adjacent wafer. The jets are at sufficient pressure and at sufficiently spaced-apart locations around the wafer stack to cause the outermost wafer to separate longitudinally from the adjacent wafer without lateral movement there between. The method further includes attaching to a planar surface of the outermost wafer and moving the attached outermost wafer and wafer stack relatively apart, thereby separating the wafers in the stack without contact between a solid object and a wafer edge.

An apparatus in accordance with the invention is also disclosed. The apparatus includes a base and a chuck attached to the base. The chuck is adapted to attach to a planar surface of an outermost wafer in a stack. A plurality of nozzles is adapted to direct multiple jets of fluid between the outermost wafer and an adjacent wafer. The jets are at sufficient pressure and at sufficiently spaced-apart locations around the wafer stack to cause the outermost wafer to separate longitudinally from the adjacent wafer without lateral movement there between. The nozzles can be attached to the base or be separated therefrom, such as on a container that surrounds the wafer stack.

These and other aspects of the invention are described below with respect to several embodiments thereof.

BRIEF DESCRIPTION OF THE DRAWINGS

FIG. 2 is a perspective view of a first embodiment of separating apparatus according to the invention.

FIG. 3 is a perspective view of the bottom of the apparatus of FIG. 2.

FIG. 4 is a cross-sectional view of the apparatus taken along line 4—4 in FIG. 2.

FIG. 6A is a cross-sectional view of the apparatus of FIG. 6 taken along line 6A—6A in FIG. 5, before the separating apparatus is operated to separate a wafer from the wafer stack.

FIG. 6B is another cross-sectional view of the apparatus of FIG. 6 taken along line 6A—6A in FIG. 5, after the separating apparatus is operated to separate a wafer from the wafer stack.

DETAILED DESCRIPTION

Figure 1:
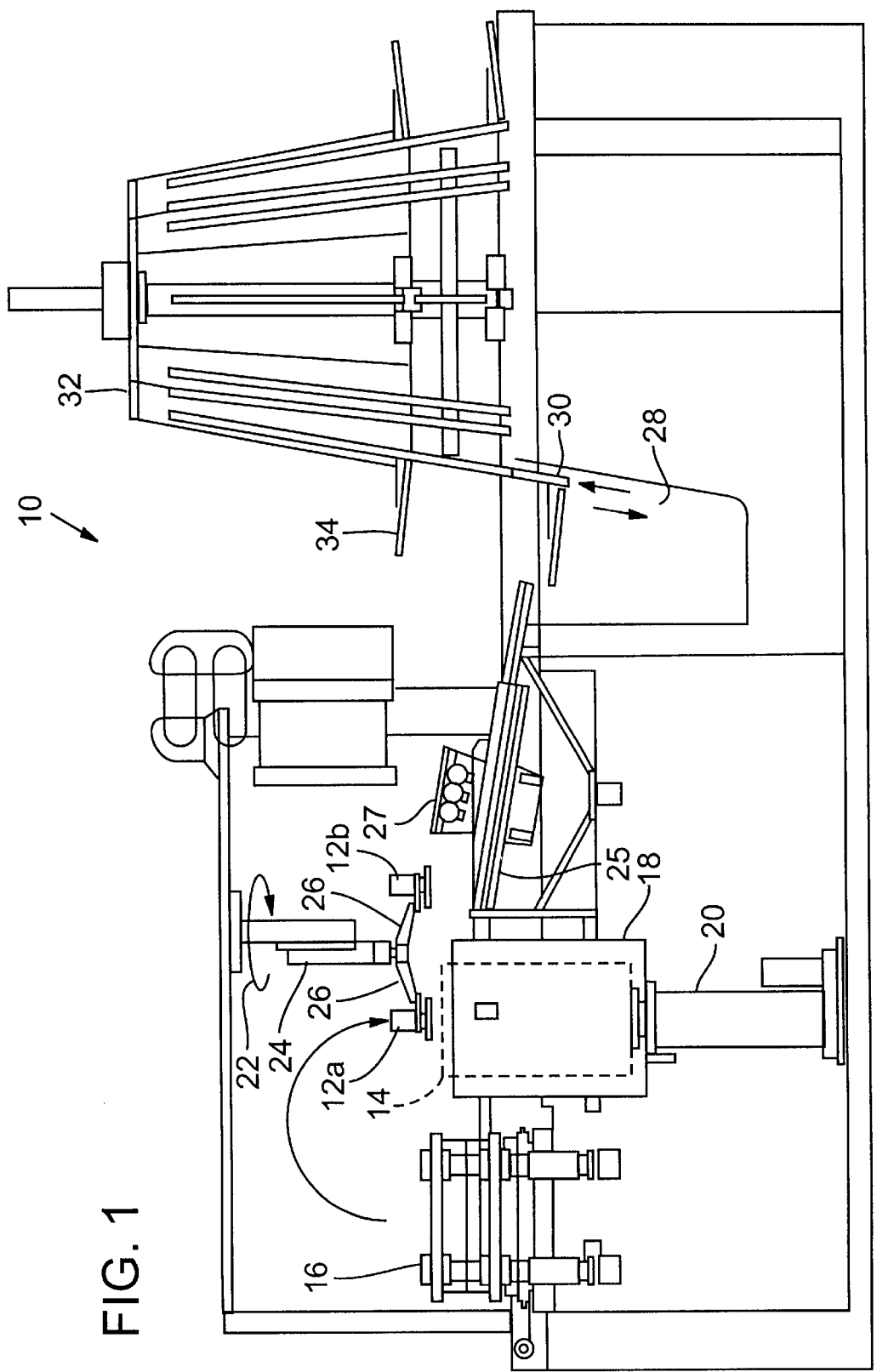
FIG. 1 is a side view of a wafer processing station in accordance with the invention.

FIG. 1 is a side view of a wafer processing station 10 that includes an apparatus 12a according to the invention for separating wafers from a wafer stack 14. Such stacks of wafers are produced upon the sawing of rod-shaped and block-shaped booles by multiple cutting methods such as wire frame sawing. The wafer stack is initially received and secured in a clamp 16. The clamp is then rotated vertically, as indicated by the arrow, to transfer the stack into a water-filled chamber 18. Within the chamber 18, the stack 14 sits atop a lead screw 20 that can be turned to incrementally raise and lower the stack relative to the chamber.

Mounted rotationally above the chamber 18 is a de-stacking mechanism 22 to which the apparatus 12 is attached. The mechanism 22 includes a rotatable support member 24 having a pair of arms 26. At the distal end of each arm is mounted a separating apparatus 12a, 12b. While the de-stacking mechanism 22 includes two separating apparatuses in the illustrated embodiment, fewer or more may be included, depending on the design objective. With the apparatus 12a positioned over the wafer stack 14, the mechanism 22 lowers the apparatus 12a to just above the outermost wafer in the stack and then activates the apparatus to separate that wafer from the adjacent wafer in the stack. The method of separation will be described hereafter in more detail. The apparatus 12a attaches to the planar surface of the outermost wafer, the apparatus is lifted away from the stack, and the mechanism 22 rotates to position the apparatus and attached wafer above a water slide 25. The mechanism 22 then lowers the apparatus 12a to just above the water slide and releases the wafer onto it. Substantially simultaneously with the release, the mechanism activates the other apparatus 12b, now positioned over the wafer stack 14, to attach to the next outermost wafer in the stack. The mechanism then lifts the apparatus 12a away from the stack, rotates, and positions the apparatus over the water slide 24 for releasing this next wafer. In this manner, the wafers are separated one by one from the stack 14.

From the slide, the separated wafers are cleansed by a cleaning system 27 that sprays the wafers clean of debris as they slide toward a water-filled basin 28. Within the basin is an arm 30 of a carousel 32. The arm supports a number of cassettes 34 into which the wafers slide as they leave the slide 25. The arm 30 moves downward each time a cassette 34 is filled with a wafer until all of the cassettes are filled. At that point, the arm 30 retracts from the basin 28, the carousel 32 rotates to position another arm 30 above the basin 28, and the new arm moves downward to put an empty cassette 34 in position for catching the next wafer from the water slide 25. In this way, the wafers are cleansed and packaged in protective cassettes before further handling.

From the slide, the separated wafers are cleansed by a cleaning system 27 that sprays the wafers clean of debris as they slide toward a water-filled basin 28. Within the basin is an arm 30 of a carousel 32. The arm supports a number of cassettes 34 into which the wafers slide as they leave the slide 24. The arm 30 moves downward each time a cassette 34 is filled with a wafer until all of the cassettes are filled. At that point, the arm 30 retracts from the basin 28, the carousel 32 rotates to position another arm 30 above the basin 28, and the new arm moves downward to put an empty cassette 34 in position for catching the next wafer from the water slide 24. In this way, the wafers are cleansed and packaged in protective cassettes before further handling As noted above, a drawback of prior wafer processing stations has been that significant numbers of wafers are often damaged in the separation process because of contact between a solid object and a wafer edge. Until these edges are polished, they are susceptible to cracking when grasped, pressed, or otherwise pushed against solid objects. Turning now to FIG. 2, a first embodiment 100 of a separating apparatus 12a, which separates the wafers without such edge contact, is shown in more detail. The apparatus includes a base 102 to which is moveably attached a pair of adjustable arms 104 held in desired position by set screws 106. A hollow center post 108 extends from a hole defined in the center of the base 102. Attached to the center post is a vacuum fitting 112 to which is connected a vacuum line 118. Attached to each arm 104 is a set of fittings 116 that each connects to a compressed air line 122. The lines 122 supply compressed air through the fittings to multiple nozzles 114 (four of which are used in the illustrated embodiment). As will be described, the nozzles are adapted to direct jets of air (or other fluid) between an outermost wafer 120 in the stack 14 and an adjacent wafer, the jets being at sufficient pressure and sufficiently spaced-apart locations around the wafer stack to cause the outermost wafer to separate longitudinally from the adjacent wafer without lateral movement there between.

FIG. 3 is a perspective view of the bottom of the separating apparatus 100. The center post 108 defines an inner channel 210 that opens on one end at the bottom of base 102 and opens on another end at the vacuum fitting 112, thereby providing a vacuum at the channel opening in the bottom of the base when the, apparatus is operable. Encircling the channel is a rim 212 to which.is fitted an O-ring 214 that together form a chuck for attaching to and supporting a wafer 120. FIG. 3 also shows the location and direction of the nozzles 114 relative to the apparatus base 102. The nozzles are directed such that jets of compressed air flow in a plane substantially parallel to the planar surface of the wafer 120 when the apparatus 100 is operable. Additionally, the nozzles are spaced sufficiently apart from the base 102 so that the air can be directed between the outermost wafer 120 and the adjacent wafer of the stack 14. In the illustrated embodiment, each jet of air provided by a nozzle is substantially opposed by another jet in the plane, thereby canceling any tendency of the jets to urge the wafer 120 to move laterally. This is most easily accomplished by making the pressure within each jet substantially equal. Other pressure arrangements can, of course, be used to prevent lateral wafer movement.

FIG. 4 is a cross-sectional view of the apparatus 100, which more clearly shows the relative positions of the nozzles 114, the O-ring 214, and the wafers to be separated. Also shown within the center post 108 are a circular end 406 of the channel 210 that opens to the vacuum fitting 112 and the bell-shaped end 404 of the channel 210 that opens through the base 102. The opposing arrows adjacent the nozzles 114 indicate the direction of the fluid jets coming therefrom. Note that the outermost wafer 120 is driven longitudinally from the adjacent wafer (in this case, upward) by the jets, but is not driven laterally into the nozzles or other solid objects. The only objects coming into contact with the edges of the wafers is either fluid in the container 18 when the wafers are in the stack 14 or the air from the nozzles 114 as the outermost wafer 120 is driven apart from the stack.

The operation of the separating apparatus 100 will now be described. If the wafers are stacked vertically within the container 18 (FIG. 1 ), a separating apparatus 100 (12a in FIG. 1) is situated directly above the wafer stack 14 as shown in FIGS. 1 and 4. (Wafers can conceivably be stacked horizontally, or in any other orientation without affecting the operation.) A vacuum is applied to the vacuum line 118 and is channeled to the base of the center post. Compressed air, emitted as jets from nozzles 114, is directed inward, parallel to the wafers and between the outermost and adjacent wafers on the stack 14. The compressed air causes the outermost wafer 120 to separate from the stack 14. Ambient air pressure and the vacuum in center post 108 then attach the wafer to the O-ring 214. A vacuum sensor (not shown) in the vacuum line 112 or elsewhere senses that the outermost wafer 120 has sealed the vacuum channel, indicating that the wafer has been separated from the stack and is attached to the chuck. The vacuum sensor signals that the wafer is present, and the support member 24 of the de-stacking mechanism 22 moves the outermost wafer away from the stack 14 by lifting the apparatus and rotating toward the water slide 25. When the apparatus 100 is above the water slide, the mechanism lowers it to a release height. The vacuum is then removed, causing the release of the wafer 120. Substantially simultaneously with the release of the wafer, another apparatus 100 (12b in FIG. 1) is activated to separate the next outermost wafer from the stack 14. The process of separating the wafers continues with the apparatuses 12a and 12b alternately attaching to a wafer separated from the stack and moving the separated wafer to the water slide. In this process, no edge of a wafer is contacted by a physical object. Only air (or another fluid) makes contact with a wafer edge. The only contact a wafer is between the soft O-ring 214 and a planar surface of the wafer.

Figure 5:
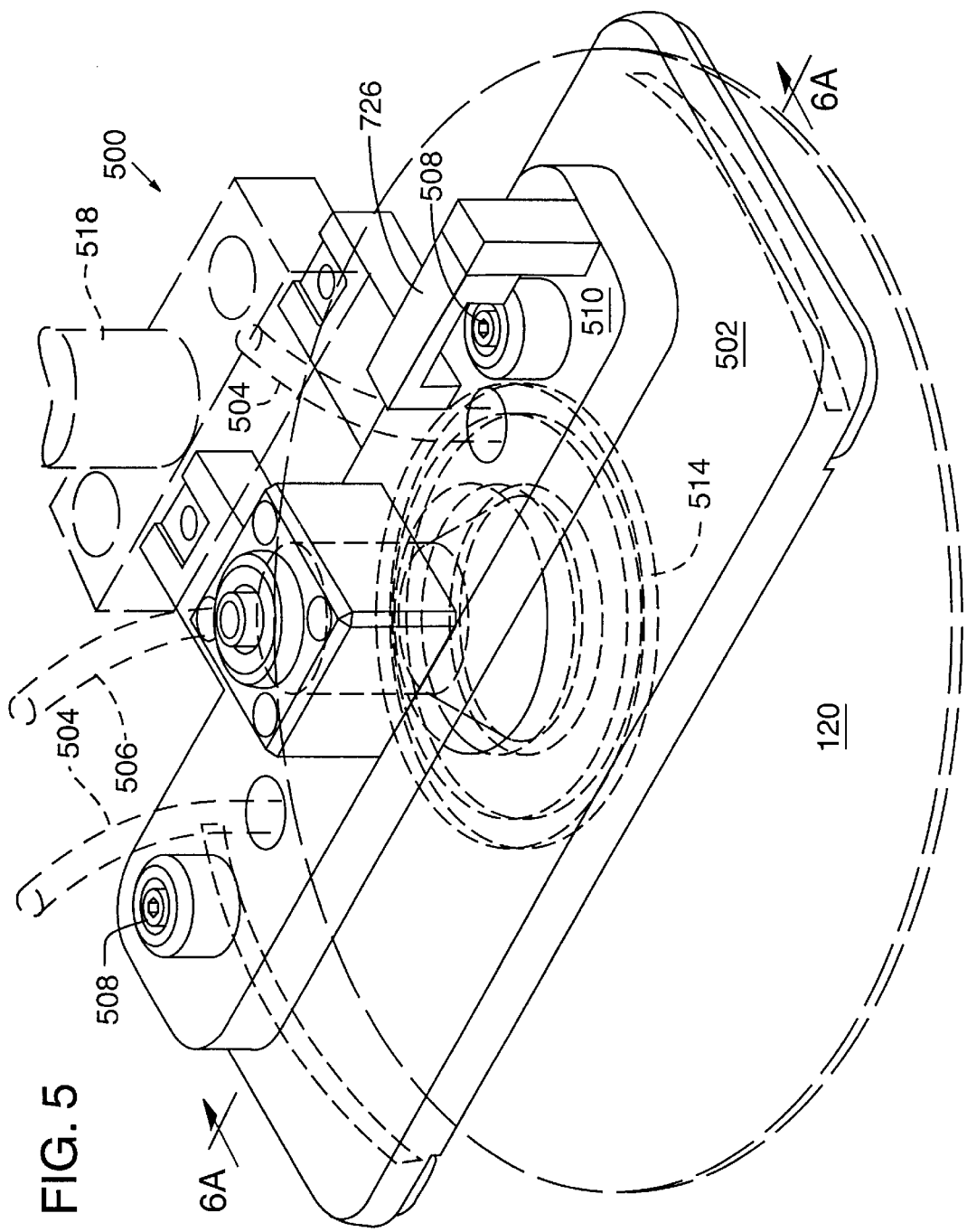
FIG. 5 is a perspective view of a second embodiment of a separating apparatus according to the invention.

A second embodiment 500 of a separating apparatus 12a is shown in FIGS. 5, 6A, and 6B. It includes a base 502; hoses 504 that connect to a compressed air supply; a manifold 510 for directing the compressed air; and a vacuum hose. A flexible bellows-like boot 514 channels the vacuum, located within the body of the base, into a broad opening 516. A stem 518 attached to the base serves as the connecting point to the de-stacking mechanism 22. FIG. 6A is a first cross-sectional view of the apparatus 500, before it has been activated to separate the outermost wafer 120 from the wafer stack 14. FIG. 6B a second cross-sectional view of the apparatus 500, after it has been activated to separate the outermost wafer from the wafer stack. As in the first embodiment, compressed air emitted from nozzles 728 causes a separation of the outermost wafer 120 from the rest of the wafer stack 14. The vacuum at the base of the flexible boot 514 then causes the outermost wafer to attach to a chuck in the form of the boot 514 and an O-ring attached to the base 502. The atmospheric pressure on the bottom of the wafer in turn pushes on the underside of the base, which is an unbalanced force because of the vacuum present in the flexible boot 514. Consequently, the boot collapses somewhat, until the base meets the manifold 510. The outermost wafer 120 is lifted from the wafer stack 14. As shown in FIG. 6B, pins 508 are lifted upward with the base 502. One of the two pins interrupts a light beam of a photo-electric switch 726, signaling the de-stacking mechanism 22 to lift the apparatus 500 (and attached wafer 120) away from the wafer stack 14. The separating apparatus is then transported to its destination and lowered to a wafer release height as described above with respect to FIG. 1. When the desired position for the apparatus has been reached, the vacuum is released, causing the base to, drop away from manifold. The wafer then separates from the base and boot 514, dropping to its final destination. The apparatus 500 is then raised again and returned to the wafer stack 14. There the vacuum is again applied to the vacuum line 506, and the separating apparatus is lowered to pick up the next wafer in the stack.

A separating apparatus in accordance with this invention, of course, is not limited to these two embodiments. While compressed air is described above as the fluid directed through the nozzles 114, other fluids, both compressible and incompressible can be used. Fewer or more than two separating apparatuses can be employed. The number of nozzles per set can vary from as few as two to as many as desired. Chucks other than a vacuum chuck, such as electrostatic chucks, or magnetic chucks, can be used to hold the separated wafer. The release and attachment of wafers can happen simultaneously or at different intervals. The wafer can be attached first and the air then directed between the wafers, or vice versa.

I claim:

1. A method for individually separating wafers from a stack of wafers, the method comprising:
   directing multiple jets of fluid between an outermost wafer in the stack and an adjacent wafer, the jets being at sufficient pressure and at sufficiently spaced-apart locations around the wafer stack to cause the outermost wafer to separate longitudinally from the adjacent wafer without lateral movement there between;
   attaching to a planar surface of the outermost wafer; and
   moving the attached outermost wafer and wafer stack relatively apart,
   thereby separating the wafers in the stacking without contact between a solid object and a wafer edge.

2. The method of claim 1 wherein the directing comprises directing the multiple jets of fluid in a same plane substantially parallel to a planar surface of the outermost wafer.

3. The method of claim 1 wherein each jet of fluid is substantially opposed by another jet of fluid.

4. The method of claim 1 wherein the pressure of each jet of fluid is substantially equal.

5. The method of claim 1 wherein the number of jets of fluid is at least four.

6. The method of claim 1 wherein the fluid is compressible.

7. The method of claim 1 wherein the attaching includes creating a vacuum that attracts the planar surface of the outermost wafer to a chuck.

8. The method of claim 1 wherein the attaching includes creating an electrostatic force that attracts the planar surface of the outermost wafer to a chuck.

9. The method of claim 1 wherein the attaching includes creating a magnetic field that attracts the planar surface of the outermost wafer to a chuck.

10. The method of claim 1 wherein the moving includes lifting the attached outermost wafer longitudinally from the wafer stack.

11. The method of claim 1 wherein the moving includes withdrawing the wafer stack longitudinally from the attached outermost wafer.

12. The method of claim 1 including submerging the wafer stack in a container of liquid and then raising the stack incrementally from the liquid before directing multiple jets of fluid between the outermost wafer and adjacent wafer in the stack.

13. The method of claim 1 including releasing the attached outermost wafer substantially simultaneously with attaching to the planar surface of another outermost wafer in the stack.

14. The method of claim 1 wherein the directing of multiple jets of fluid occurs prior to the attaching to the planar surface of the outermost wafer.

15. A method for individually separating wafers from a stack of wafers, the method comprising:
    directing multiple jets of a fluid between an outermost wafer in the stack and an adjacent wafer in a same plane substantially parallel to a planar surface of the outermost wafer, the jets being at sufficient pressure and at sufficiently spaced-apart locations around the wafer stack to cause the outermost wafer to separate longitudinally from the adjacent wafer without lateral movement there between;
    attaching to a planar surface of the outermost wafer;
    lifting the attached outermost wafer longitudinally from the wafer stack;
    moving the lifted and attached outermost wafer laterally from the wafer stack; and releasing the attached outermost wafer apart from the stack, thereby separating the wafers in the stack without contact between a solid object and a wafer edge.

16. An apparatus for separating wafers from a stack of wafers, comprising:

a base;

a plurality of nozzles connected to the base and adapted to direct multiple jets of fluid between a outermost wafer in the stack and an adjacent wafer, the jets being at sufficient pressure and at sufficiently spaced-apart locations around the wafer stack to cause the outermost wafer to separate longitudinally from the adjacent wafer without significant lateral movement there between; and a chuck attached to the base and adapted to attach to a planar surface of the outermost wafer.

17. A de-stacking mechanism for individually separating wafers from a stack of wafers, comprising:

a first apparatus including:

a base;

a plurality of nozzles attached to the base and adapted to each direct a jet of fluid between an outermost wafer in the stack and an adjacent wafer at sufficient pressure and at sufficiently spaced-apart locations around the wafer stack to cause the outermost wafer to separate longitudinally from the adjacent wafer without significant lateral movement there between; and a chuck attached to the base and adapted to attach to a planar surface of the outermost wafer;

a second apparatus including:

a base;

a plurality of nozzles attached to the base and adapted to each direct a jet of fluid between an outermost wafer in the stack and an adjacent wafer at sufficient pressure and at sufficiently spaced-apart locations around the wafer stack to cause the outermost wafer to separate longitudinally from the adjacent wafer without lateral movement there between; and a chuck attached to the base and adapted to attach to a planar surface of the outermost wafer; and a supported member adapted to support the first apparatus and the second apparatus over a wafer stack.

18. The apparatus of claim 16 wherein the nozzles are attached to the base.

19. The apparatus of claim 16 wherein the nozzles are adapted to direct the jets of fluid in a same plane substantially parallel to the planar surface of the outermost wafer.

20. The apparatus of claim 16 including a sensor adapted to sense when the outermost wafer is attached to the chuck.

* * * * *

UNITED STATES PATENT AND TRADEMARK OFFICE
CERTIFICATE OF CORRECTION

PATENT NO. : 6,558,109 B2  Page 1 of 1
DATED : May 6, 2003
INVENTOR(S) : David S. Gibbel It is certified that error appears in the above-identified patent and that said Letters Patent is hereby corrected as shown below:

Column 4,
Line 16, delete "the, apparatus" and insert -- the apparatus --.
Line 17, delete "which.is" and insert -- which is --.

Column 5,
Line 48, delete "to, drop" and insert -- to drop --.

Column 6,
Line 13, delete "stacking" and insert -- stack --.

Signed and Sealed this

Eighteenth Day of May, 2004

JON W. DUDAS
*Acting Director of the United States Patent and Trademark Office*